United States Patent [19]
Kawamura et al.

[11] Patent Number: 5,528,135
[45] Date of Patent: Jun. 18, 1996

[54] SHEET CERAMIC PACKAGE HAVING ELECTRICALLY INDEPENDENT PRODUCTS UNITS

[75] Inventors: Sigeki Kawamura; Kazuhiko Ito, both of Yamaguchi, Japan

[73] Assignee: Kabushiki Kaisya Sumitomo Kinzoku Ceramics, Yamaguchi, Japan

[21] Appl. No.: 108,395

[22] Filed: Aug. 18, 1993

[30] Foreign Application Priority Data

Aug. 18, 1992 [JP] Japan ................................. 4-242747

[51] Int. Cl.$^6$ ................................. G01R 31/28
[52] U.S. Cl. ................................. 324/158.1; 324/73.1
[58] Field of Search ................................. 324/754, 765, 324/72.5, 158.1, 73.1; 437/8; 251/40, 48; 174/68.5; 29/840

[56] References Cited

U.S. PATENT DOCUMENTS

| | | | |
|---|---|---|---|
| 3,746,973 | 7/1973 | McMahan, Jr. | 324/158.1 |
| 4,417,392 | 11/1983 | Ibrahim et al. | 29/840 |
| 4,426,773 | 1/1984 | Hargis | 29/832 |
| 4,467,400 | 8/1984 | Stopper | 174/68.5 |
| 4,796,080 | 1/1989 | Phy | 357/70 |
| 4,866,508 | 9/1989 | Eichelberger et al. | 324/158.1 |
| 5,059,899 | 10/1991 | Farnworth et al. | 324/73.1 |
| 5,237,268 | 8/1993 | Honma et al. | 324/754 |

*Primary Examiner*—Vinh P. Nguyen
*Attorney, Agent, or Firm*—Christopher R. Pastel; Thomas R. Morrison

[57] ABSTRACT

A sheet ceramic package includes a plurality of product units, such as ceramic substrates and circuit substrates for semiconductor devices. The individual product units can be separated from the sheet ceramic package by breaking them apart along snap lines. Each product unit has inner layer conductors for providing external connections to a semiconductor to be packaged therein. A dummy part, with conductor patterns for evaluating the electrical characteristics of corresponding units, surrounds at least partially the periphery of each product unit. Exposed conductors of the product units and the dummy parts are plated by means of electroless plating allowing the product units to be electrically independent of each other because of the absence of the need to apply a uniform plating potential. Semiconductors are packaged into the individual product units and are hermetically sealed. The entire sheet ceramic package of the present invention is then tested, prior to the physical separation of product units, to determine the electrical characteristics of each individual product unit, using the evaluating patterns described above. The electrically independent product units make it unnecessary to break the sheet up into individual product units to test their electrical characteristics. Thus, the present invention eliminates the troublesome process of breaking the sheet into individual units and arranging them on a jig set for individual testing as required by the conventional sheet package. The efficiency of testing the product units thus improves dramatically.

9 Claims, 4 Drawing Sheets

SHEET CERAMIC PACKAGE HAVING ELECTRICALLY INDEPENDENT PRODUCTS UNITS

BACKGROUND OF THE INVENTION

The present invention relates to a sheet ceramic package that comprises a plurality of product units such as ceramic substrates and circuit substrates for semiconductors. More particularly, the present invention relates to a sheet ceramic package that comprises a plurality of product units whose electrical characteristics can be inspected and evaluated—to determine, for example, whether they are electrically conductive or not—before breaking them up into separate, individual units.

Conventional sheet ceramic packages comprise a plurality of product units that can be separated into individual units by breaking them apart along break grooves, score lines, or other snap lines. Such conventional ceramic packages are constructed as follows. Dummy parts surround each individual product unit, separating the product units one from another along the snap lines. Each product unit has conductive lines which serve to provide external electrical connection points to a semiconductor therein. Interconnecting conductor patterns are set on the dummy parts and serve to interconnect all the conductive lines of all the product units for the purpose of electroplating. The electroplating provides a plating of high conductivity and corrosion resistant materials.

In such sheet ceramic packages, the semiconductor is packaged into each product unit, which is then hermetically sealed. The individual units are then broken apart along the snap lines. Each unit thus broken up is then placed on an inspection jig where its electrical characteristics are determined using each solder pad pattern.

These conventional packages present disadvantages however. First, since the sheet is electroplated as a whole, all the inner layer conductors of the product units must be electrically connected. This is required by the electroplating process since all material to be plated must be charged with respect to a plating solution. Therefore, complete electrical interconnection is used to apply the correct potential. Accordingly, the electrical characteristics of the individual product units can be evaluated only when they are broken up into separate units. It is impossible to inspect the entire sheet at once. Second, to inspect product units, each must be placed on a jig. When its electrical characteristics are evaluated, each product unit must have the same surface, either its front or its back, facing in the same direction. This requirement makes the inspection quite troublesome.

OBJECTS AND SUMMARY OF THE INVENTION

An object of the present invention is to overcome the drawbacks of the prior-art ceramic packages.

A further object of the present invention is to provide a sheet ceramic package the electrical characteristics of whose individual units can be evaluated independently even though they are in sheet form.

Briefly stated, a sheet ceramic package of the present invention comprises a plurality of product units, such as ceramic substrates and circuit substrates for semiconductors. The individual product units can be separated from the sheet ceramic package by breaking them apart along snap lines. Each product unit has inner layer conductors for providing external connections to a semiconductor to be packaged therein. A dummy part, with conductor patterns for evaluating the electrical characteristics of corresponding units, surrounds at least partially the periphery of each product unit. Exposed conductors of the product units and the dummy parts are plated by means of electroless plating allowing the product units to be electrically independent of each other because of the absence of the need to apply a uniform plating potential. Semiconductors are mounted into the individual product units and are hermetically sealed. The entire sheet ceramic package of the present invention is then tested, prior to the physical separation of product units, to determine the electrical characteristics of each individual product unit, using the evaluating patterns described above. The electrically independent product units make it unnecessary to break the sheet up into individual product units to test their electrical characteristics. Thus, the present invention eliminates the troublesome process of breaking the sheet into individual units and arranging them on a jig set for individual testing as required by the conventional sheet package. The efficiency of testing the product units thus improves dramatically.

According to an embodiment of the invention, there is provided a sheet ceramic package for packaging semiconductors comprising: a plurality of individual product units, each of the individual product units being separated by a plurality of snap lines, the plurality of snap lines being effective for physically separating each of the individual product units when breaking-apart forces are applied to the package, each of the individual product units having recessed cavity for accepting at least one of the semiconductors, conductors, within each of the product units, for providing external connections to the at least one of the semiconductors, the conductors each having an exposed portion, plated by electroless plating, within the cavities for accepting electrical connections to the at least one of the semiconductors, each of the individual product units being provided with at least one associated dummy part, the dummy parts having test pads on an exposed surface, the test pads being plated by electroless plating, connection means for electrically connecting the test pads to corresponding ones of the conductors, and each of the individual product units being conductively independent for effecting testing of the individual product units while the individual product units remain physically connected.

An embodiment of the invention further provides a sheet ceramic package as described above, wherein the connection means comprises: test conductors within the dummy parts contiguous with the conductors, and the test conductors being electrically connected to the test pads by via holes in the dummy parts.

According to a feature of the present invention there is provided a ceramic sheet of semiconductor packages comprising: a plurality of product units, the plurality of product units being attached in a sheet and having snap lines as boundaries, dummy areas, each associated with one of the plurality of product units, the product units each defining a cavity for accepting a semiconductor, the product units having conductor means for providing external electrical connections to the semiconductor after the product units are separated along the snap lines, the dummy areas having test connection means for providing connection points connected to the conductor means of the one of the plurality of product units associated therewith, and the product units, and the dummy areas associated therewith, being electrically independent while attached in the ceramic sheet such that the product units are individually testable.

According to another feature of the invention, a method of forming a sheet ceramic package from which individual product units may be detached and of testing the individual units prior to their detachment, which method comprises: forming a ceramic sheet that is a sintered laminate comprising a plurality of ceramic green sheets, forming within the ceramic sheet a plurality of individual units each of which has a cavity effective to hold a semiconductor therein, printing conductive lines in the units such that the conductive lines of respective units are electrically isolated, forming dummy parts on at least two sides of the units, forming conductive test patterns on the dummy parts, the conductive test patterns being connected to the conductive lines, forming snap lines defining boundaries the units, treating the ceramic sheet by electroless plating such that exposed conductive surfaces are plated and the conductive lines of respective ones of the units remain electrically isolated, fixing a semiconductor device into each of the units, hermetically sealing each of the units, and testing each of the units for electrical characteristics while the units are integral with the ceramic sheet.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 6:
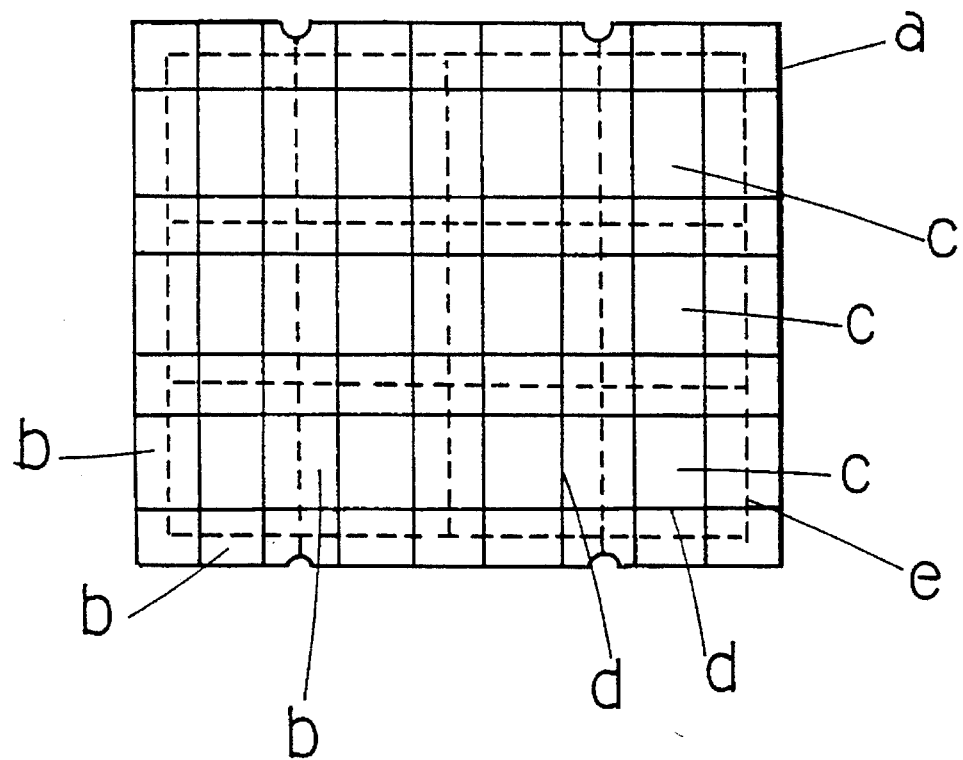
FIG. 6 is a plan view of a conventional sheet ceramic package of the prior art.

Referring to FIG. 6, ceramic sheet packages of the prior art are fabricated in a single sheet. Individual product units c have adjoining dummy parts b along each edge. The product units c are arranged in rows and columns along snap lines d. The product units c each contain conductor patterns (not shown) for connecting to semiconductor devices (not shown) housed within the product units. An interconnecting conductor pattern e is located on dummy parts b and serves to electrically interconnect all the conductor patterns of each of the product units c. This interconnecting is necessary for electroplating the conductor patterns of the product units c. As a result of the electroplating, the surfaces of the conductive patterns become thoroughly plated with a high conductivity material to provide for low resistance connections to semiconductor devices within the product units.

In such sheet ceramic packages, a semiconductor device is mounted into each product unit, which is then hermetically sealed. The individual product units are separated by breaking the sheet along snap lines d. After the sheet is broken up, each unit is placed individually on an inspection jig for testing the unit's electrical characteristics using each solder pad pattern.

Figure 1:
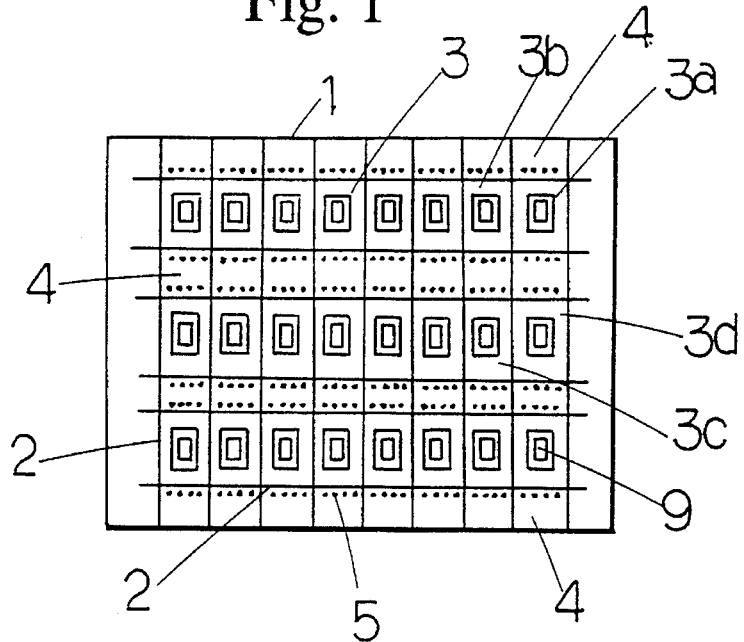
FIG. 1 is a plan view of an embodiment of the sheet ceramic package of the present invention.
Figure 2A:
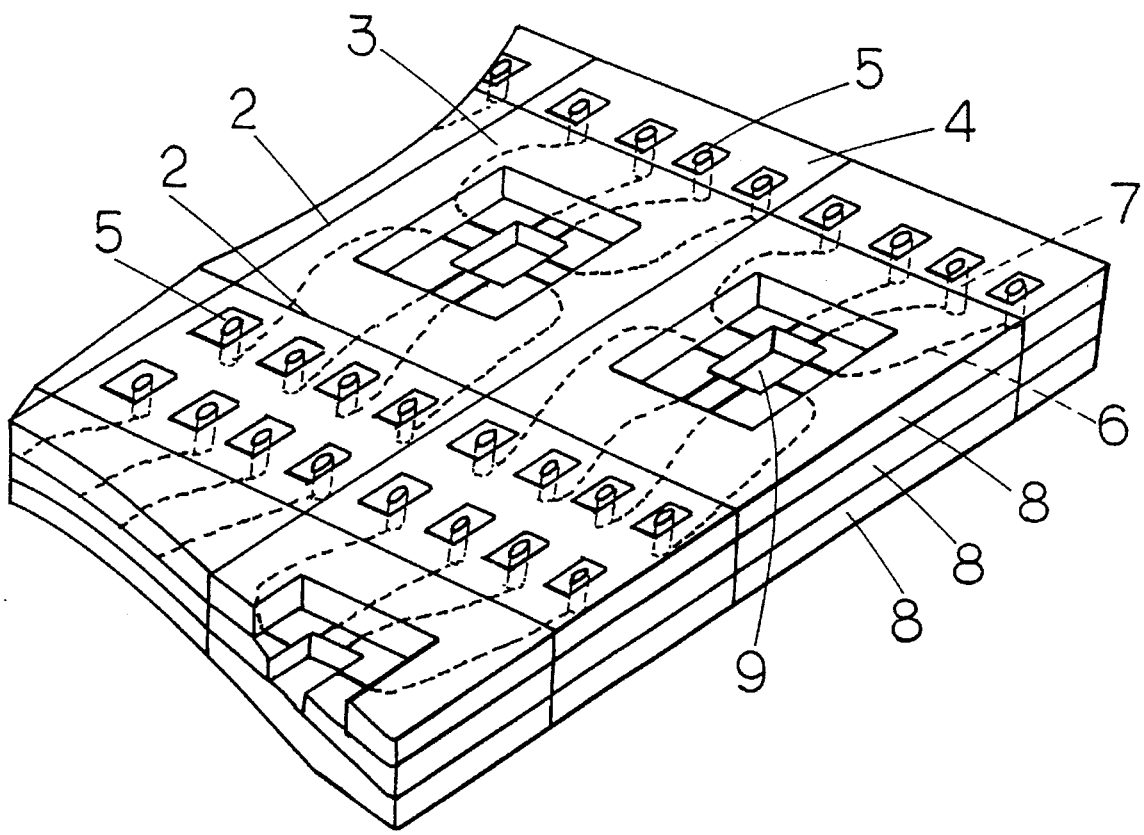
FIG. 2a is a partially expanded perspective view of the embodiment of FIG. 1.

Referring to FIGS. 1 and 2a, in a sheet ceramic package of the present invention, a ceramic sheet 1 comprises a plurality of individual product units 3 that are separable by breaking the sheet apart along snap lines 2. Individual product units 3 are conductively independent of each other. Each is provided with dummy parts 4 on two opposing sides. Test pads 5 for evaluating the electrical characteristics of corresponding units 3 are located on the surface of the dummy parts 4. Test pads 5 are usually formed by printing, for example, by screen-printing techniques. Other suitable techniques for creating conductive lands may be employed by those skilled in the art and are within the scope and spirit of the present invention.

Figure 2B:
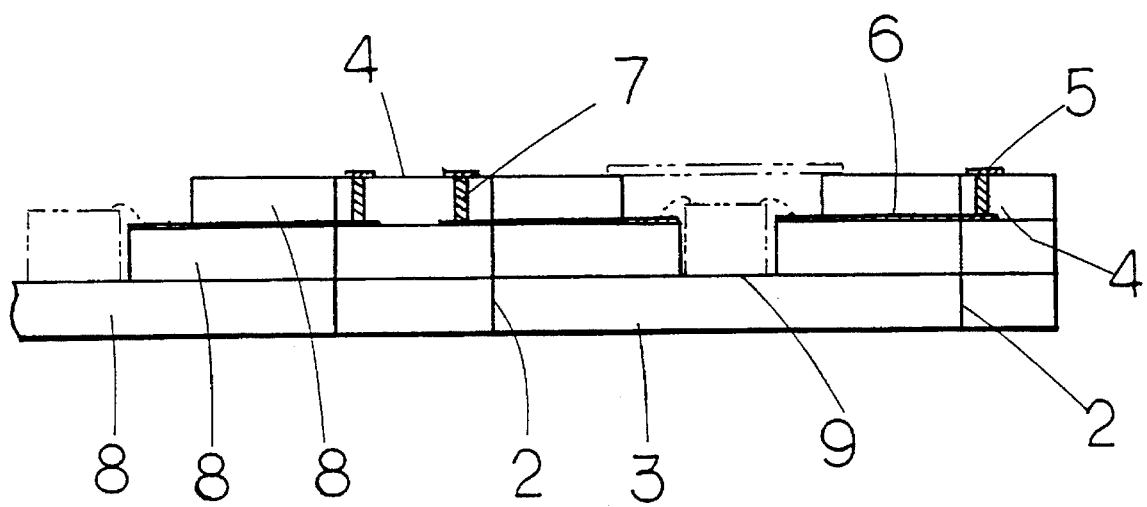
FIG. 2b is a cross sectional view of the embodiment of FIG. 1.

Referring to FIGS. 2a and 2b, ceramic sheet 1 is produced in heat treatment after stacking a plurality of green sheets 8. Inner layer conductors 6 of the product units 3 are printed upon one of several ceramic green sheets 8 and have wire bonding patterns 14 which are exposed and serve to provide connection points for wire bonding to semiconductors 10 (shown by a dashed outline in FIG. 2b) which are to be affixed upon conductive pads 9. The inner layer conductors 6 are generally formed from metals such as tungsten and molybdenum which are printed in a metallic paste. Via holes 7 are filled with a conductor formed from the metallic paste. During sintering of the ceramic green sheet at temperatures in the range of 1000°–1500° C., the inner layer conductors 6 and other printed conductors described herein are metalized. Such metals as tungsten are, however, subject to oxidation which interferes with connections to the inner layer conductors 6. Therefore, wire bonding patterns 14 of the inner layer conductors 6 and the test pads 5 must be plated with metals such as nickel and gold to prevent oxidation from occurring. Generally, nickel is applied as a base plate upon which gold is applied. The test pads 5 and a conductive pad 9 are similarly formed.

Referring to FIG. 2a, the wire bonding pattern 14 of inner layer conductor 6 has a plated layer 14b, composed of gold on nickel, plated upon conductor layer 14a. Similarly, the test pads 5 and a conductive pad 9 have plated layers, 5b and 9b, on top of tungsten conductor layers, 5a and 9a, respectively.

Referring to FIG. 2b the application of electroless plating to all exposed conductive areas of the sheet ceramic package 1 is illustrated. The semiconductor device 10 is bonded to the conductive pad 9 using conventional techniques after plating is completed. Pad 9 provides a platform for semiconductor device 10 and can be used to provide a ground connection to semiconductor device 10. Wire bonds 13 connect the wire bonding patterns 14 of inner layer conductors 6 to terminals on the semiconductor 10. Outer connecting terminals 15 are provided on a rear surface of the product unit 3 and serve to provide external connection points to the semiconductor in the product unit 3. The outer connecting terminals 15 are composed of a printed layer of metal 15a and a plated layer 15b. Via holes 16 are filled with a conductor and electrically connect the outer connecting terminals 15 with corresponding inner layer conductors 6. The product units 3 are then hermetically sealed by means of covers 11 (shown by dashed lines).

Whereas the prior art employed electroplating, the present invention uses electroless plating which does not require the application of an electric potential to the inner layer conductors and thus does not require their interconnection throughout the ceramic sheet 1. The electroless plating process plates the exposed portions of the inner layer conductors 6 and the test pads 5 by means of a chemical reaction with the conductor material without the need for the application of an electric potential. Therefore, the inner layer conductors 6 of each product unit 3a, 3b, 3c, and 3d, remain electrically independent of one another. Prior to the electroless plating, the ceramic surfaces are cleaned and an activating material is applied to exposed conductors which reacts with the electroless plating solution. Removal of palladium contamination of ceramic surfaces reduces unwanted deposits of plating material. Control of plating conditions such as temperature, concentration, and impurities allows selective electroless plating to be achieved. Alternatively, or in the case of unwanted deposits, masking or etching techniques may be used to effect selective electroless plating. Snap lines 2 on ceramic sheet 1 serve as break grooves or break lines to make each individual product unit separable.

The test pads 5 allow electrical characteristics of their corresponding individual product units 3 to be evaluated before the product units 3 are separated. As shown in FIGS. 2a–2b, the test pads 5 are connected to the inner conductor patterns 6, of each respective individual product unit 3, by means of via holes 7 that are filled with conductor. The dummy parts 4 are wide enough to contain test pads 5 and to provide sufficient room to permit separation of the individual product units 3 smoothly by fracturing along the snap lines 2.

In an example of the present invention described above, the ceramic sheet 1 is treated by electroless plating thus plating all exposed conductive surfaces. The product units 3 are thus conductively independent of each other even when sheet ceramic package 1 is unbroken. After semiconductors are packaged into product units 3, the latter are hermetically sealed. The sheet ceramic package is then applied to a test apparatus, including, for example a bed of pins, a hand held probe, or similar device, which makes connections with the test pads 5. The sheet ceramic package of the present invention is then tested for the electronic characteristics of individual product units 3, including the semiconductors sealed therein, using test pads 5 to serially or simultaneously inspect for any abnormal electrical characteristics or failures. Such failures include inner conductive patterns 6 becoming disconnected or the semiconductors 10 malfunctioning. The testing is accomplished by applying required bias voltages and test signals to the test pads 5. The test may be conducted over a range of operating temperatures. When a product unit failure is detected, the identified product unit is removed during the separation process.

Thus, it is possible to test the electrical characteristics of the whole ceramic sheet 1 without breaking it up into individual product units 3. This ability to evaluate the whole of ceramic sheet 1 at one time considerably shortens inspection and testing. Testing of a whole sheet, as provided by the ceramic package of the present invention, eliminates the disadvantages of the conventional ceramic package. The troublesome requirement that each individual product unit keep the same surface facing the same way on a jig set is eliminated. The sheet ceramic package of the present invention makes such an arrangement unnecessary, thereby increasing inspection efficiency remarkably. The sheet ceramic package thus inspected may then be broken up simply into individual product units that are packed into shipping trays.

Figure 3:
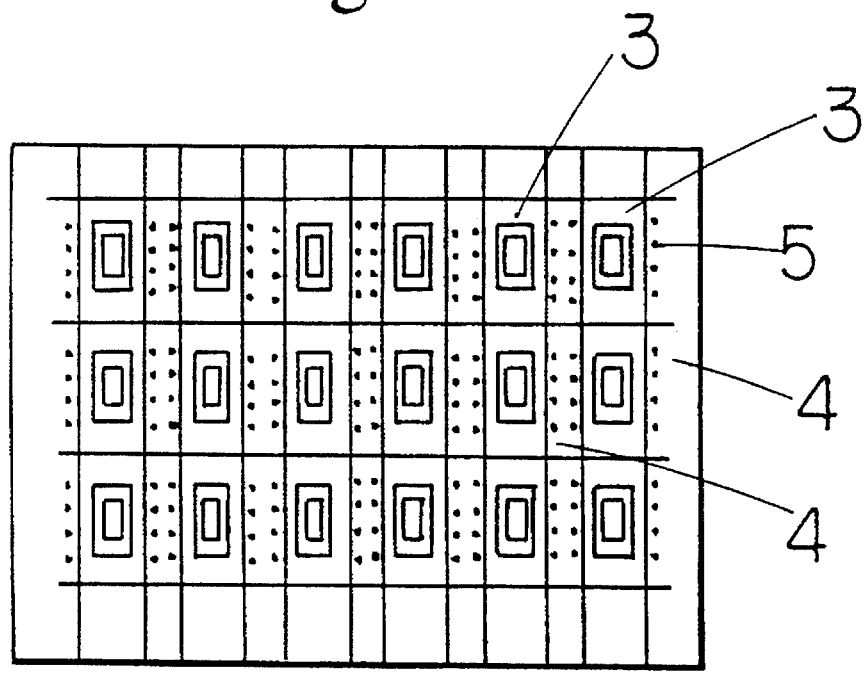
FIG. 3 is a plan view of another embodiment of the present invention in which dummy parts are located on both sides of the individual product units.
Figure 4:
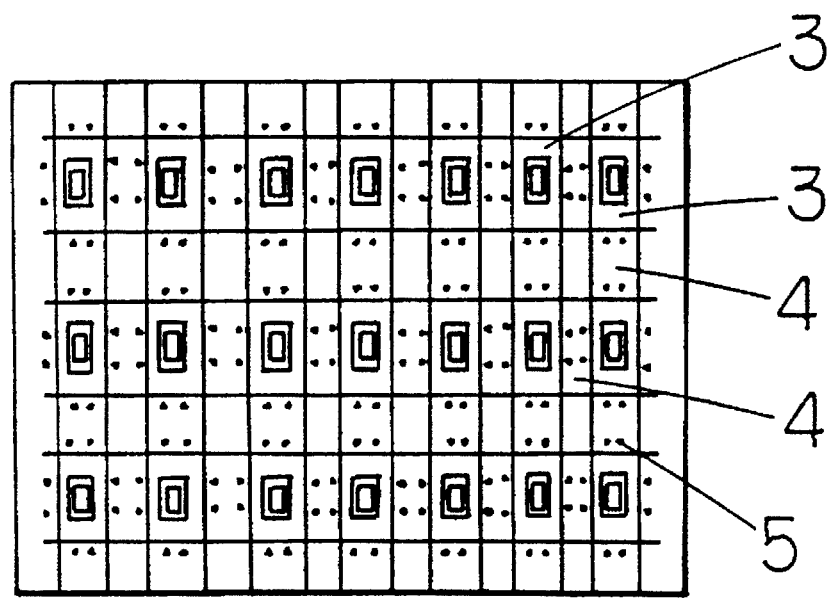
FIG. 4 is a plan view of still another embodiment of the present invention in which dummy parts are located around the periphery of the individual product units.
Figure 5:
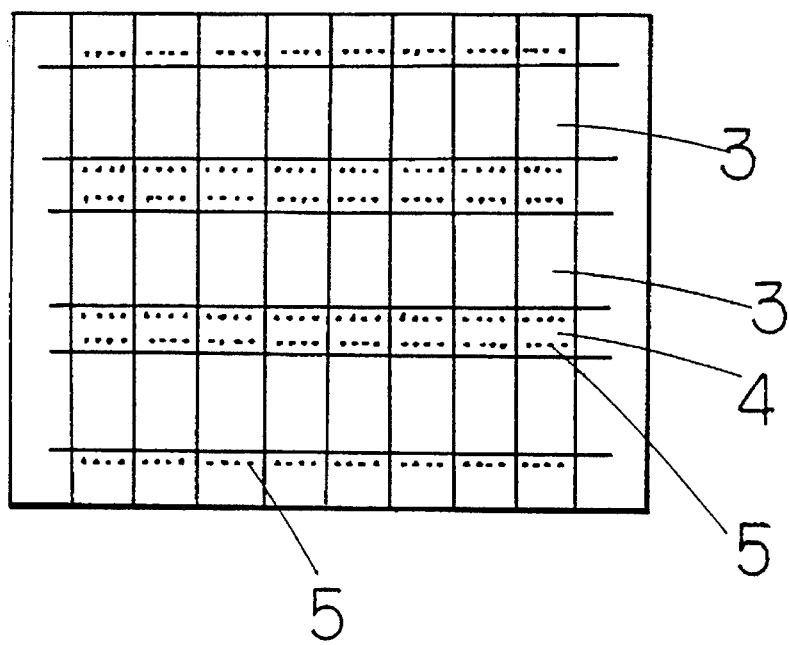
FIG. 5 is a plan view of a particular embodiment of the present invention in which patterns for the evaluation of electrical characteristics of each individual unit are located on the back surface of dummy parts.

Referring to FIGS. 3 and 4, although dummy parts 4 are located on upper and lower sides of each individual product unit 3 in the embodiment described above, they may be located on right and left sides or around the periphery, depending on inner conductive patterns 6 of units 3. Further, referring to FIG. 5, test pads 5 for testing electrical characteristics may also be placed on the back surfaces of dummy parts 4 if necessary. Other arrangements of the dummy parts in relation to the product units 3 may be realized by those skilled in the are and are within the scope and spirit of the present invention.

In conclusion, according to the sheet ceramic package of the present invention, individual product units 3 are conductively independent of each other. They are provided with dummy parts 4, which have test pads 5 on at least a part of their periphery. Test pads 5 correspond to each individual product unit 3 and are used for testing the electrical characteristics of each product unit 3. This construction allows product units 3 to be tested as part of a whole ceramic sheet 1 for their electrical characteristics using test pads 5 located on dummy parts 4.

In addition, according to the sheet ceramic package of the present invention, ceramic sheet 1 can be tested as a sheet without breaking it up into individual product units 3 and placing the latter individually on a jig set, which effectively increases the efficiency of inspection.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A sheet ceramic package for mounting semiconductors comprising:

a plurality of individual product units;

each of said individual product units being separated by a plurality of snap lines;

said plurality of snap lines being effective for physically separating each of said individual product units when breaking-apart forces are applied to said package;

each of said individual product units comprising a chip mounting portion with a mounting pad for mounting said semiconductors; a wire bonding pattern including a plurality of inner layer conductors; and a plurality of outer connecting terminals on said product unit;

said wire bonding pattern exposed outside of said sheet ceramic package;

said wire bonding pattern being electroless plated;

each of said product units having at least one associated dummy part;

said plurality of outer connecting terminals being exposed outside said at least one dummy part;

each of said dummy parts having a plurality of test pads on an exposed surface;

said plurality of outer connecting terminals connected to said test pads;

said test pads being plated by electroless plating;

connection means for electrically connecting said test pads to corresponding ones of said plurality of inner layer conductors in said wire bonding pattern; and each of said individual product units being conductively independent for effecting testing of said individual product units while said individual product units remain physically connected.

2. A sheet ceramic package as in claim 1, wherein said connection means comprises:

a plurality of conductors within said dummy parts contiguous with said wire bonding pattern; and said conductors being electrically connected to said test pads through via holes in said dummy parts.

3. A sheet ceramic package as in claim 1, wherein said dummy parts are located on right and left sides of said product units.

4. A sheet ceramic package as in claim 1, wherein said dummy parts are located on upper and lower sides of said product units.

5. A sheet ceramic package as in claim 1, wherein said wire bonding patterns are placed on one of a front and back surface of said dummy parts.

6. A sheet ceramic package as in claim 1, wherein said dummy parts are located around a periphery of said product units.

7. A ceramic sheet of semiconductor packages comprising:

a plurality of product units;

said plurality of product units in said ceramic sheet having snap lines as boundaries;

a plurality of dummy areas, each associated with one of said plurality of product units;

said product units each defining a cavity for accepting a semiconductor;

said product units having conductor means for providing external electrical connections to said semiconductor after said product units are separated along said snap lines;

each of said dummy areas having test connection means for providing connection points connected to said conductor means of said one of said plurality of product units associated therewith; and said product units, and said dummy areas associated therewith, being electrically independent while attached in said ceramic sheet such that said product units are individually testable.

8. A ceramic sheet of semiconductor packages, as in claim 7, wherein:

said conductor means includes exposed conductors within said cavities;

said test connection means includes exposed test pads on surfaces of said dummy areas; and said exposed conductors and said exposed test pads are plated by means of electroless plating.

9. A sheet ceramic package according to claim 7, wherein a conductive pad is printed in said cavity for mounting said semiconductor and is electroless plated.

* * * * *